(12) United States Patent
Tangudu et al.

(10) Patent No.: US 11,239,854 B2
(45) Date of Patent: Feb. 1, 2022

(54) NON-LINEARITY CORRECTION

(71) Applicant: TEXAS INSTRUMENTS INCORPORATED, Dallas, TX (US)

(72) Inventors: Jawaharlal Tangudu, Bengaluru (IN); Pankaj Gupta, Dausa (IN); Sreenath Narayanan Potty, Bengaluru (IN); Ajai Paulose, Idukki (IN); Chandrasekhar Sriram, Chennai (IN); Mahesh Ravi Varma, Thrissur (IN); Shabbar Abbasi Vejlani, Bengaluru (IN); Neeraj Shrivastava, Bengaluru (IN); Himanshu Varshney, Bengaluru (IN); Divyeshkumar Mahendrabhai Patel, Bengaluru (IN); Raju Kharataram Chaudhari, Pune (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/061,730

(22) Filed: Oct. 2, 2020

(65) Prior Publication Data
US 2021/0105021 A1 Apr. 8, 2021

(30) Foreign Application Priority Data

Oct. 3, 2019 (IN) .............................. 201941040030
Oct. 18, 2019 (IN) .............................. 201941042295

(51) Int. Cl.
*H03M 1/36* (2006.01)
*H03M 1/12* (2006.01)

(52) U.S. Cl.
CPC ........... *H03M 1/367* (2013.01); *H03M 1/124* (2013.01); *H03M 1/1235* (2013.01)

(58) Field of Classification Search
CPC .... H03M 1/367; H03M 1/1235; H03M 1/124; H03M 1/60; H03M 1/1033; H03M 1/1085; H03M 1/0678
(Continued)

(56) References Cited

U.S. PATENT DOCUMENTS 6,449,110 B1 * 9/2002 DeGroat ................ G11B 5/012
  360/31
7,012,772 B1 * 3/2006 Vis .................... G11B 20/10009
  360/46

(Continued)

OTHER PUBLICATIONS

International Search Report in corresponding PCT Patent Application No. PCT/US2020/054214, dated Dec. 3, 2020 (2 pages).
(Continued)

*Primary Examiner* — Lam T Mai
(74) *Attorney, Agent, or Firm* — John R. Pessetto; Charles A. Brill; Frank D. Cimino

(57) ABSTRACT

A non-linearity correction circuit includes a non-linearity coefficient estimation circuit. The non-linearity coefficient estimation circuit includes a data capture circuit, a non-linearity term generation circuit, a time-to-frequency conversion circuit, a bin identification circuit, a residual non-linearity conversion circuit, and a non-linearity coefficient generation circuit. The non-linearity term generation circuit is coupled to the data capture circuit. The time-to-frequency conversion circuit is coupled to the data capture circuit and the non-linearity term generation circuit. The bin identification circuit is coupled to the time-to-frequency conversion circuit. The residual non-linearity conversion circuit is coupled to the bin identification circuit. The non-linearity coefficient generation circuit is coupled to the bin identification circuit and the residual non-linearity conversion circuit.

28 Claims, 10 Drawing Sheets

(58) Field of Classification Search
USPC .......................................................... 341/138
See application file for complete search history.

(56) References Cited

U.S. PATENT DOCUMENTS

| | | |
|---|---|---|
| 7,352,306 B2 | 4/2008 | Xu |
| 8,427,175 B2 | 4/2013 | Kidambi |
| 8,542,138 B2 | 9/2013 | Galton |
| 9,219,493 B1 | 12/2015 | Kunnen et al. |
| 9,503,112 B1* | 11/2016 | Zanbaghi ............ H03M 1/0602 |
| 9,935,645 B1* | 4/2018 | Tangudu ................ H03M 1/08 |
| 2006/0097108 A1* | 5/2006 | Liu .......................... G01D 3/02 |
| | | 244/79 |
| 2010/0194611 A1 | 8/2010 | Kibune |
| 2011/0043392 A1 | 2/2011 | Anthony |
| 2017/0324421 A1 | 11/2017 | Tangudu |
| 2020/0169279 A1* | 5/2020 | Gunturi .................... H04B 1/30 |
| 2021/0105019 A1* | 4/2021 | Gupta ................ H03M 1/1085 |
| 2021/0105021 A1* | 4/2021 | Tangudu ............. H03M 1/1033 |

OTHER PUBLICATIONS

International Search Report in corresponding PCT Patent Application No. PCT/US2020/054258, dated Feb. 11, 2021 (2 pages).

* cited by examiner

NON-LINEARITY CORRECTION

CROSS-REFERENCE TO RELATED APPLICATIONS

The present application claims priority to Indian Provisional Patent Application No. 201941040030, filed Oct. 3, 2019, entitled "A Low-SNR Reference ADC Aided Non-Linearity Estimation in Presence of Source Non-Linearity," and Indian Provisional Patent Application No. 201941042295, filed Oct. 18, 2019, entitled "Frequency Domain Estimation of Coefficients of a Multi-Tap Volterra and Derivative Based Non Linearity Corrector," each of which is hereby incorporated herein by reference in its entirety.

BACKGROUND

An analog-to-digital converter (ADC) is a circuit that converts a continuous time signal (e.g., a voltage or current) into a discrete time representation that is proportional in magnitude to the continuous time signal. ADCs are used for signal measurement in a variety of electronics systems, such as mobile phones, audio and video equipment, wireline communications systems, measurement equipment, and radar systems. Various error sources affect ADC performance. For example, ADCs of all types may suffer from quantization error, non-linearity, and/or clock jitter.

SUMMARY

A non-linearity correction circuit includes a non-linearity coefficient estimation circuit. The non-linearity coefficient estimation circuit includes a data capture circuit, a non-linearity term generation circuit, a time-to-frequency conversion circuit, a bin identification circuit, a residual non-linearity conversion circuit, and a non-linearity coefficient generation circuit. The non-linearity term generation circuit is coupled to the data capture circuit. The time-to-frequency conversion circuit is coupled to the data capture circuit and the non-linearity term generation circuit. The bin identification circuit is coupled to the time-to-frequency conversion circuit. The residual non-linearity conversion circuit is coupled to the bin identification circuit. The non-linearity coefficient generation circuit is coupled to the bin identification circuit and the residual non-linearity conversion circuit.

A non-linearity correction circuit includes a data path, a reference path, a non-linearity term generation circuit, a bin identification circuit, a residual non-linearity conversion circuit, and a non-linearity coefficient generation circuit. The data path includes a first digital step attenuator (DSA), a first analog-to-digital converter (ADC), a first data capture circuit coupled to the first ADC, and a first time-to-frequency conversion circuit coupled to the first data capture circuit. The reference path includes a second DSA, A second ADC, a second data capture circuit, a second time-to-frequency conversion circuit, a channel estimation circuit, a channel equalization circuit, and a source non-linearity subtraction circuit. The second DSA includes an input coupled to an input of the first DSA. The second ADC is coupled to the second DSA. The second data capture circuit is coupled to the second ADC. The second time-to-frequency conversion circuit is coupled the second data capture circuit. The channel estimation circuit is coupled to the first time-to-frequency conversion circuit and the second time-to-frequency conversion circuit. The channel equalization circuit is coupled to the channel estimation circuit and the second time-to-frequency conversion circuit. The source non-linearity subtraction circuit is coupled to the channel equalization circuit and the first time-to-frequency conversion circuit. The non-linearity term generation circuit is coupled to the first data capture circuit and the first time-to-frequency conversion circuit. The bin identification circuit is coupled to the source non-linearity subtraction circuit and the first time-to-frequency conversion circuit. The residual non-linearity conversion circuit is coupled to the bin identification circuit. The non-linearity coefficient generation circuit is coupled to the bin identification circuit and the residual non-linearity conversion circuit.

A method for non-linearity correction includes receiving a signal as input to a main data path and a reference data path. The signal is digitized by a first analog-to-digital converter (ADC) of the main data path and by a second ADC of the reference data path. Output of the second ADC is subtracted from output of the first ADC. Non-linearity correction coefficients are estimated based on the reference subtracted signal. The non-linearity correction coefficients are applied to the signal to generate non-linearity corrected data.

BRIEF DESCRIPTION OF THE DRAWINGS

For a detailed description of various examples, reference will now be made to the accompanying drawings in which.

DETAILED DESCRIPTION

Figure 1:
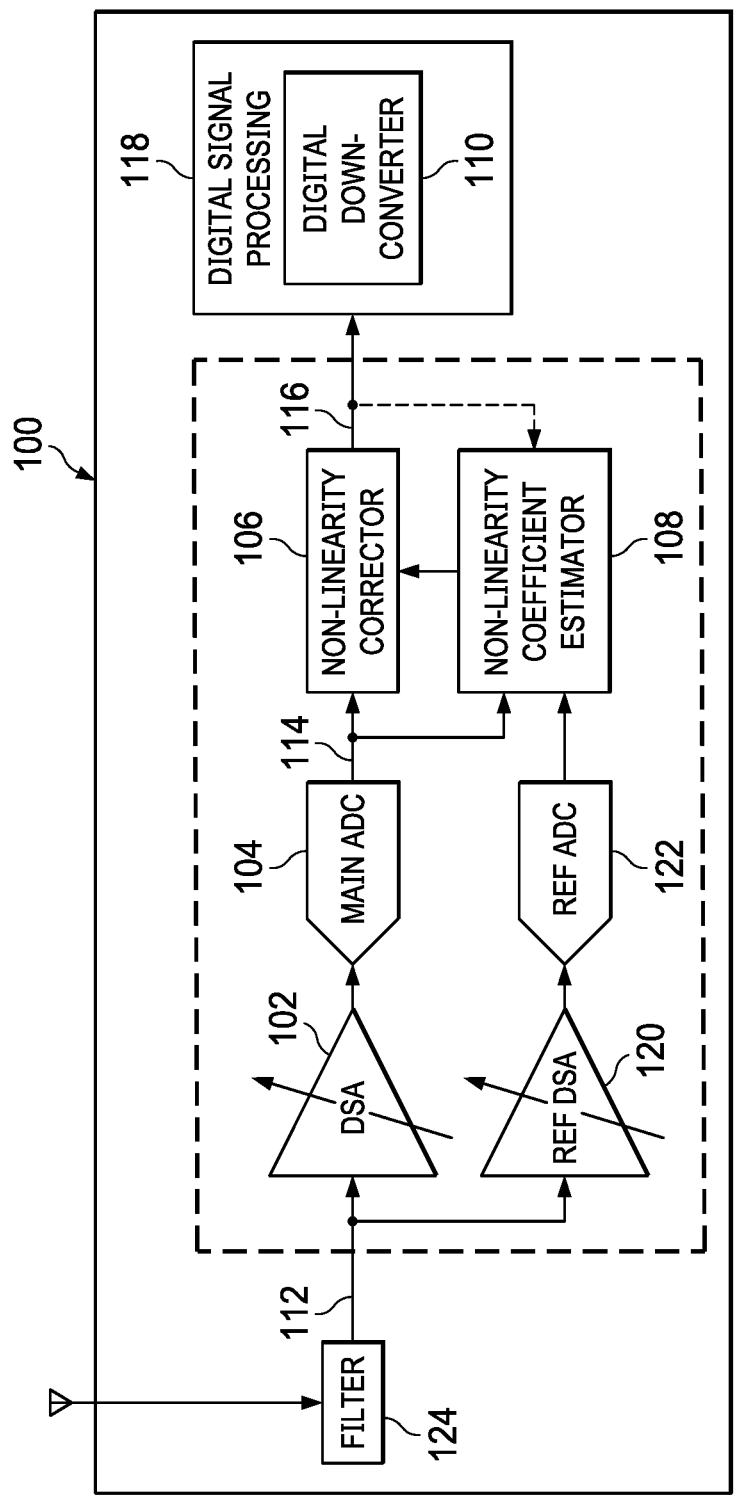
FIG. 1 shows a block diagram for a system that includes non-linearity correction for an analog-to-digital converter.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In some applications, analog-to-digital converters (ADCs) should meet stringent harmonic distortion and/or intermodulation distortion specifications. For example, ADCs used in wireless infrastructure should meet strict third harmonic distortion and intermodulation distortion requirements to conform to cellular system standards. Harmonic distortion (e.g., third harmonic distortion) and intermodulation distortion of an ADC can be improved by applying a factory calibrated digital non-linearity correction to the output of the ADC. Because an ADC may operate over a wide range of sampling rates, and good non-linearity performance is desirable for all sampling rates, in some non-linearity correction systems, non-linearity correction coefficients are provided for each supported sampling rate, Nyquist zone, and digital step attenuator (DSA) range, and stored in memory. The time needed to perform the in-factory calibration and the memory needed to store the coefficients increases device cost. Other non-linearity sources, such as $2^{nd}$ order non-linearity caused by the board on which a device is mounted, and changes due to temperature, voltage, and/or aging are not accounted for by factory calibration.

The non-linearity correction circuits disclosed herein determine non-linearity correction coefficients at run-time. Accordingly, the cost of the device can be reduced by eliminating in-factory calibration, and non-volatile storage of the correction coefficients. The non-linearity correction circuit includes a non-linearity coefficient estimation circuit that captures data at either the input or output of the non-linearity corrector circuit, generates non-linearity terms based on the captured data, and converts the captured data and the non-linearity terms from time domain to frequency domain. The frequency bins having a low level of signal and a high level of non-linearity terms are selected for use in non-linearity correction coefficient estimation. If output of the non-linearity corrector circuit was captured, then the response of the captured data is converted from residual non-linearity to full non-linearity. Non-linearity correction coefficients are estimated based on the non-linearity terms and captured data for the selected frequency bins.

In some systems, the ADC input signal is highly non-linear. For example, digital pre-distortion may be applied to the ADC input signal. Implementations of the non-linear correction circuit disclosed herein, ensure that ADC non-linearity is corrected and that non-linearity in the ADC input signal is unaffected by the non-linearity correction. The non-linearity correction circuit includes a main data path and reference data path. An input signal is digitized in each of the data paths and converted from time domain to frequency domain. A channel estimate is computed for the reference data path with respect to the main data path, and the channel estimate is applied to equalize the reference data path. Equalized reference data path data is subtracted from the main data path data, and the difference is provided to the non-linearity coefficient estimation circuit along with the main data path ADC output for use in generating non-linearity correction coefficients.

FIG. 1 shows a block diagram for a system 100 that includes non-linearity correction for an analog-to-digital converter. The system 100 implements a portion of a radio-frequency receiver in some examples. The system 100 includes a digital step attenuator (DSA) circuit 102, an ADC 104, a non-linearity corrector circuit 106, non-linearity correction coefficient estimator 108, and a digital signal processing circuit 118. Some implementations of the system 100 include a second DSA circuit 120 and a second ADC 122. The digital signal processing circuit 118 is implemented in a digital signal processor (DSP) or other digital circuitry, and includes a digital down-converter 110. The DSA circuit 102 attenuates an input signal 112 by an attenuation value that is selectable by digital value provided to the DSA circuit 102. The input signal 112 is a radio frequency signal in some examples, and is filtered by a filter circuit 124 (e.g., to limit the bandwidth of the input signal 112). The DSA circuit 102 is coupled to the ADC 104. Similarly, the DSA circuit 120 attenuates the input signal 112 by an attenuation value that is selectable by digital value provided to the DSA circuit 120. The DSA circuit 120 is coupled to the ADC 122. The ADC 122 digitizes the 112 with better linearity than the ADC 104 in some implementations of the 100 as further described herein, and the output of the ADC 122 is applied to compensate for non-linearity in the input signal 112.

The ADC 104 digitizes the output of the DSA circuit 102. The output of the ADC 104 includes non-linearities introduced by the ADC 104 and DSA circuit 102. The non-linearity corrector circuit 106 receives the digital signal 114 output by the ADC 104 and processes the digital signal 114 to compensate for the non-linearities introduced by the ADC 104 and the DSA circuit 102. The non-linearity correction coefficient estimator 108 determines coefficient values used by the non-linearity corrector circuit 106 to compensate for the non-linearities of the ADC 104 and the DSA circuit 102. The non-linearity correction coefficient estimator 108 estimates non-linearity correction coefficients for a given sampling rate, Nyquist zone, DSA settings, etc. at which the ADC 104 operates.

The non-linearity corrector circuit 106 applies the non-linearity correction coefficients to the digital signal 114 to compensate for the non-linearities of the ADC 104 and the DSA circuit 102, and provides non-linearity corrected data 116 to the digital signal processing circuit 118. In the digital signal processing circuit 118, the digital down-converter 110 down-converts the non-linearity corrected data 116 and provides down-converted in-phase and quadrature-phase data to downstream circuitry for further processing. For example, the digital down-converter 110 multiples the non-linearity corrected data 116 by sine and cosine signals of a local oscillator.

Figure 2:
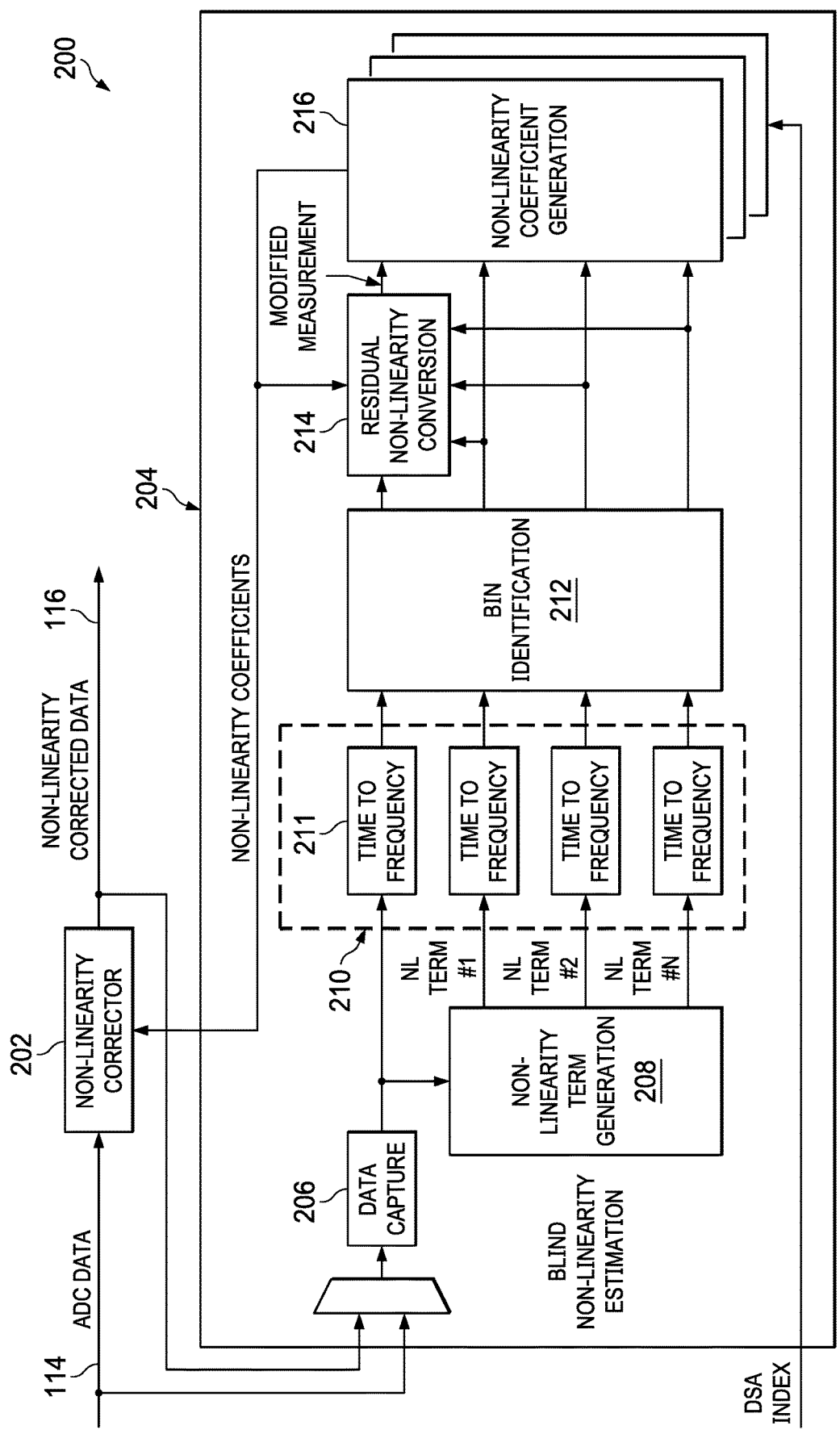
FIG. 2 shows a block diagram for a non-linearity correction circuit in accordance with the present disclosure.

Non-linearity of the ADC 104 is modeled by applying a multi-tap Voltera model and a derivative term based model to the raw output samples of the ADC 104. For example, non-linearity of the ADC 104 may be modeled using 2nd and 3rd order non-linearity terms, such as:

2nd order terms: $x^2[n]$, $x[n]x'[n]$, $x'^2[n]$
3rd order terms: $x^3[n]$, $x^2[n]x'[n]$, $x[n]x'^2[n]$, $x'^3[n]$, $x^2[n]x[n+1]$ FIG. 2 shows a block diagram for a non-linearity correction circuit 200 in accordance with the present disclosure. The non-linearity correction circuit 200 avoids the need for (and cost of) factory testing to generate the many coefficient sets needed for non-linearity compensation and the storage needed to accommodate the various operational parameters of the DSA circuit 102 and the ADC 104. Instead, the non-linearity correction circuit 200 generates non-linearity correction coefficients at run-time. The non-linearity correction circuit 200 includes a non-linearity corrector circuit 202 and a non-linearity coefficient estimation circuit 204. The non-linearity corrector circuit 202 is an implementation of the non-linearity corrector circuit 106, and is coupled to the non-linearity coefficient estimation circuit 204. The non-linearity coefficient estimation circuit 204 generates non-linearity correction coefficients, for use by the non-linearity corrector circuit 202, at run-time during normal operation of the non-linearity corrector circuit 202.

The non-linearity coefficient estimation circuit 204 includes a data capture circuit 206, a non-linearity term generation circuit 208, a time-to-frequency conversion circuit 210, a bin identification circuit 212, a residual non-linearity conversion circuit 214, and a non-linearity coefficient generation circuit 216. The data capture circuit 206 is coupled to the input of the non-linearity corrector circuit 202 and to the output of the non-linearity corrector circuit 202 to selectably capture raw data samples of the digital signal 114 or samples of the non-linearity corrected data 116 for use in generating non-linearity correction coefficients.

The data capture circuit 206 is coupled to the non-linearity term generation circuit 208 and the time-to-frequency conversion circuit 210. The non-linearity term generation circuit 208 receives captured data from the data capture circuit 206 and processes the data to generate non-linearity terms. For example a set of 256+k samples are captured from x[n] (where x[n] is the output of the ADC 104) and from the captured samples different NL terms like $x^3[n]$, $x^2[n]x'[n]$, $x^2[n]x[n+1]$, $(x'[n])^3$ are generated. For each NL term, 256 samples are generated. An additional 'k' samples i.e., 256+k are captured at the input to generate a valid 256 samples for each NL term due to the memory effect in generating the digital derivative or other memory terms. The digital derivative is typically generated by an anti-symmetric FIR filter or by other known means. The non-linearity term generation circuit 208 is coupled to the time-to-frequency conversion circuit 210 and provides the non-linearity terms generated based on the data captured by the data capture circuit 206 to the time-to-frequency conversion circuit 210. The time-to-frequency conversion circuit 210 converts the data captured by the data capture circuit 206 and the non-linearity terms generated by the non-linearity term generation circuit 208 from time-domain to frequency-domain. For example, the time-to-frequency conversion circuit 210 applies a fast Fourier transform to the captured data received from the data capture circuit 206 and the non-linearity terms generated by the non-linearity term generation circuit 208. In some implementations, the time-to-frequency conversion circuit 210 applies a fast Fourier transform after multiplying the input data by a window function.

The time-to-frequency conversion circuit 210 is coupled to the bin identification circuit 212, and provides the frequency domain data derived from the data captured by the data capture circuit 206, and its non-linearity terms to the bin identification circuit 212. The bin identification circuit 212 processes the frequency domain data to identify frequency bins to be used for generating the non-linearity correction coefficients. More specifically, the bin identification circuit 212 identifies frequency bins that have a high level of created non-linearity terms and a low level of input signal for use in generating the non-linearity correction coefficients. For example let the non-linearity terms be $x^3[n]$, $x^2[n]x'[n]$, $x^2[n]x[n+1]$, $(x'[n])^3$, then one metric for determining high level of created non-linearity terms at a frequency bin is:

$$|F(x^3(n))|^2+|F(x^2(n)x'(n))|^2+|F(x^2(n)x(n+1))|^2+|F((x'[n])^3)|^2 > \text{NLThresh} \quad (1)$$

and one metric for determining low level of signal level at a frequency bin is:

$$|F(x(n))| < \text{SigThresh} \quad (2)$$

Both the conditions above should be met to select a frequency bin for estimation.

Figure 3:
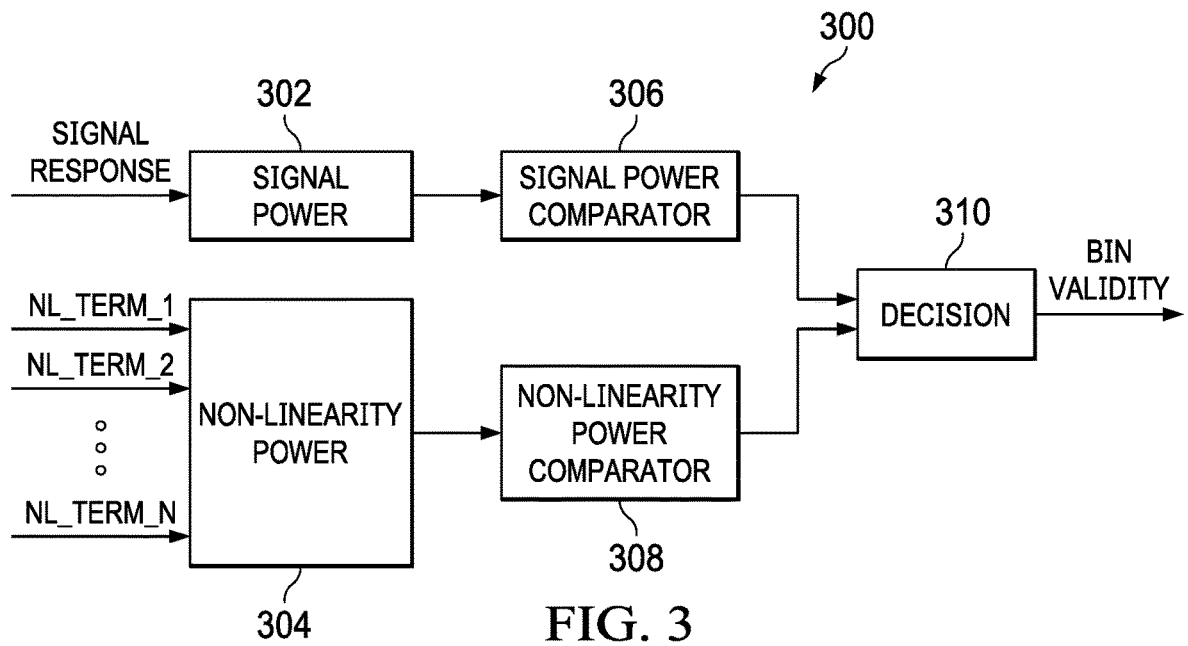
FIG. 3 shows a block diagram for a bin identification circuit in accordance with the present disclosure.

FIG. 3 shows a block diagram for a bin identification circuit 300 in accordance with the present disclosure. The bin identification circuit 300 is an implementation of the bin identification circuit 212. The bin identification circuit 300 includes a signal power circuit 302, a non-linearity term power circuit 304, a signal power comparator 306, a non-linearity term power comparator 308, and a decision circuit 310. The signal power circuit 302 computes a value of signal power for each frequency bin of the frequency domain signal received from the time-to-frequency conversion circuit 210. Similarly, the non-linearity term power circuit 304 computes a value of non-linearity term power for each frequency bin of the frequency domain non-linearity terms received from the time-to-frequency conversion circuit 210. For a given frequency bin, the non-linearity term power circuit 304 computes the non-linearity term power as the sum of the squared magnitude or sum of magnitude of all non-linearity terms at the given frequency bin in some implementations. In other implementations, magnitude of a non-linearity term that exceeds a threshold is applied to compute non-linearity term power. In other implementations, magnitude of each non-linearity terms frequency response at a given bin is compared with a threshold and even if one of them crosses the threshold it is considered as passing the non-linearity power threshold.

The signal power comparator 306 compares the frequency bin signal power values generated by the signal power circuit 302 to a signal power threshold. The non-linearity term power comparator 308 compares the frequency bin non-linearity term power values generated by the non-linearity term power circuit 304 to a non-linearity term power threshold. The decision circuit 310 identifies the frequency bins to be applied in non-linearity correction coefficient estimation based on the results of the comparisons performed by the signal power comparator 306 and the non-linearity term power comparator 308. Frequency bins having a high non-linearity term power (e.g., power above the non-linearity term power threshold) and a low signal power (e.g., power below the signal power threshold) are selected for use in non-linearity correction coefficient estimation. Thus, the decision circuit 310 identifies frequency bins for which the signal power is less than the signal power threshold and the non-linearity term power is greater than the non-linearity term power threshold as suitable for use in non-linearity correction coefficient estimation.

In an example of bin identification circuit 300 operation for $x^3[n]$ or any third order non-linearity, with a single tone input at f, the frequency response of $x^3[n]$ will be high at f and 3f. Signal level is high at the fundamental frequency f. The bin identification circuit 300 selects only the bins corresponding to 3f for use in non-linearity correction coefficient estimation.

In an example of bin identification circuit 300 operation for $x^2[n]$ or any second order non-linearity, with a single tone input at f, the frequency response of $x^2[n]$ will be high at 0 and 2f. Signal level is high at the fundamental frequency f. The bin identification circuit 300 selects only the bins corresponding to 0 and 2f for use in non-linearity correction coefficient estimation.

In an example of bin identification circuit 300 operation for $x^2[n]$ or any second order non-linearity, with a two tone inputs at f1 and f2, the frequency response of $x^2[n]$ will be high at 0, f2−f1, 2f1, f1+f2, and 2f2. The bin identification circuit 300 selects only the bins corresponding to 0, f2−f1, 2f1, f1+f2, and 2f2 for use in non-linearity correction coefficient estimation.

In an example of bin identification circuit 300 operation for a combination of 2nd and 3rd order non-linearity terms, with a single tone input at f, the bin identification circuit 300 selects only the bins corresponding to 0, 2f and 3f for use in non-linearity correction coefficient estimation.

In an example of bin identification circuit 300 operation for a combination of 2nd and 3rd order non-linearity terms, with two tone inputs f1 and f2, the bin identification circuit 300 selects both the 2nd order bins (0, f2−f1, 2f1, f1+f2, and 2f2), and the 3rd order bins (2f1−f2, 2f2−f1, 2f1+f2, 3f1, 3f2, 2f2+f1) excluding the fundamental bins f1 and f2.

Figure 4A:
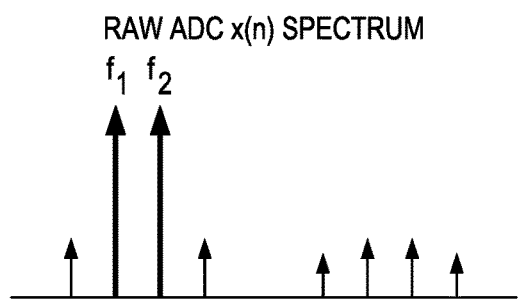
FIGS. 4A, 4B, and 4C show example bin identification for use in correction coefficient generation in accordance with the present disclosure.
Figure 4B:
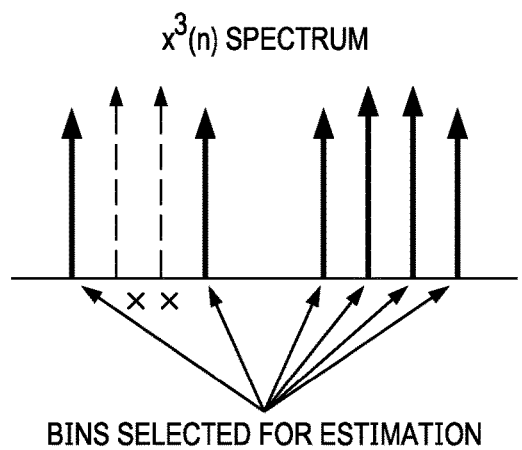

FIGS. 4A and 4B show an example bin identification in the bin identification circuit 300. FIG. 4A shows the signal power for a two tone input with frequencies $f_1$ and $f_2$. For this input signal, the third order non-linearity term ($x^3$) or any other third order non-linearity term has eight components at $2f_1-f_2$, $f_1$, $f_2$, $2f_2-f_1$, $2f_1+f_2$, $3f_1$, $3f_2$, and $2f_2+f_1$. Based on comparison of the signal and non-linearity term to the respective power thresholds, the frequency bins at $2f_1-f_2$, $2f_2-f_1$, $2f_1+f_2$, $3f_1$, $3f_2$, and $2f_2+f_1$ are selected by the bin identification circuit 300 for use in non-linearity correction coefficient estimation.

Figure 4C:
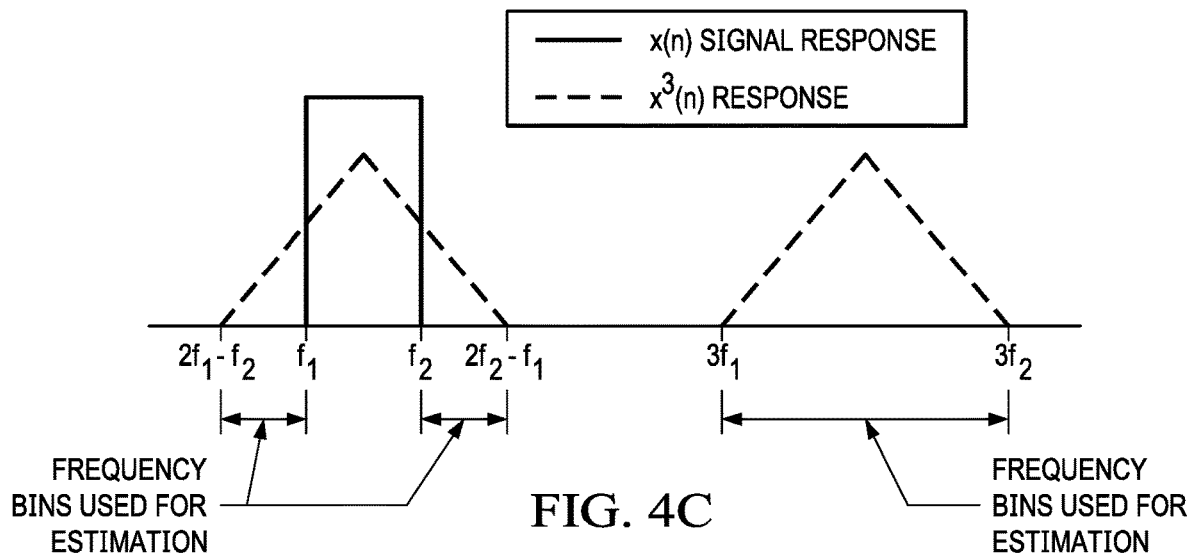

While single and two-tone examples have been provided herein to describe operation of the bin identification circuit 300, in practice, the input signal is narrow or wide-band modulated data. FIG. 4C shows an example bin identification for wide band data occupying a band from f1 to f2. The regions selected for estimation of 3rd order non-linearity terms are (2f1−f2 to f1), (f2 to 2f2−f1), and (3f1 to 3f2). The regions selected for estimation of 2nd order terms are (0 to f2−f1) and (2f1 to 2f2). These regions can be aliased back to specific frequencies based on the sampling rate of the ADC 104. In some cases, if the aliased frequencies fall back into the signal band, then those frequency bins will not be used since they will fail the signal power check.

Returning now to FIG. 2, the residual non-linearity conversion circuit 214 is coupled to the bin identification circuit 212, and allows the non-linearity corrected data 116 produced by the non-linearity corrector circuit 202 to be used as input to the non-linearity coefficient estimation circuit 204, which provides a performance improvement for the second order effects arising from a large raw level of non-linearity. The residual non-linearity conversion circuit 214 modifies the frequency response of the non-linearity corrected data 116 by adding multiple correction terms to the frequency response of the non-linearity corrected data 116. Each correction term is a product of the frequency response of each non-linearity term with the corresponding correction coefficient value applied in the non-linearity corrector circuit 202. The modification of the frequency response of the non-linearity corrected data 116 converts the non-linearity measurement from a "residual non-linearity measurement" to a "full non-linearity measurement."

The frequency bins identified by the bin identification circuit 212 and as modified by the residual non-linearity conversion circuit 214 are processed by the non-linearity coefficient generation circuit 216 to estimate and track non-linearity correction coefficients for each DSA range for use by the non-linearity corrector circuit 202. The non-linearity coefficient generation circuit 216 is coupled to the bin identification circuit 212 and the residual non-linearity conversion circuit 216, and generates the non-linearity correction coefficients for a current use configuration of the DSA circuit 102 and the ADC 104. The non-linearity coefficient generation circuit 216 includes a vector Kalman filter to generate the non-linearity correction coefficients in some implementations. At the frequency bins selected by the bin identification circuit 212, the non-linearity terms responses serve as weights to the coefficients to be estimated and the "full non-linear measurement" provided by the residual non-linearity conversion circuit 214 serve as a measurement as shown in matrix relation in equation (7).

Figure 5:
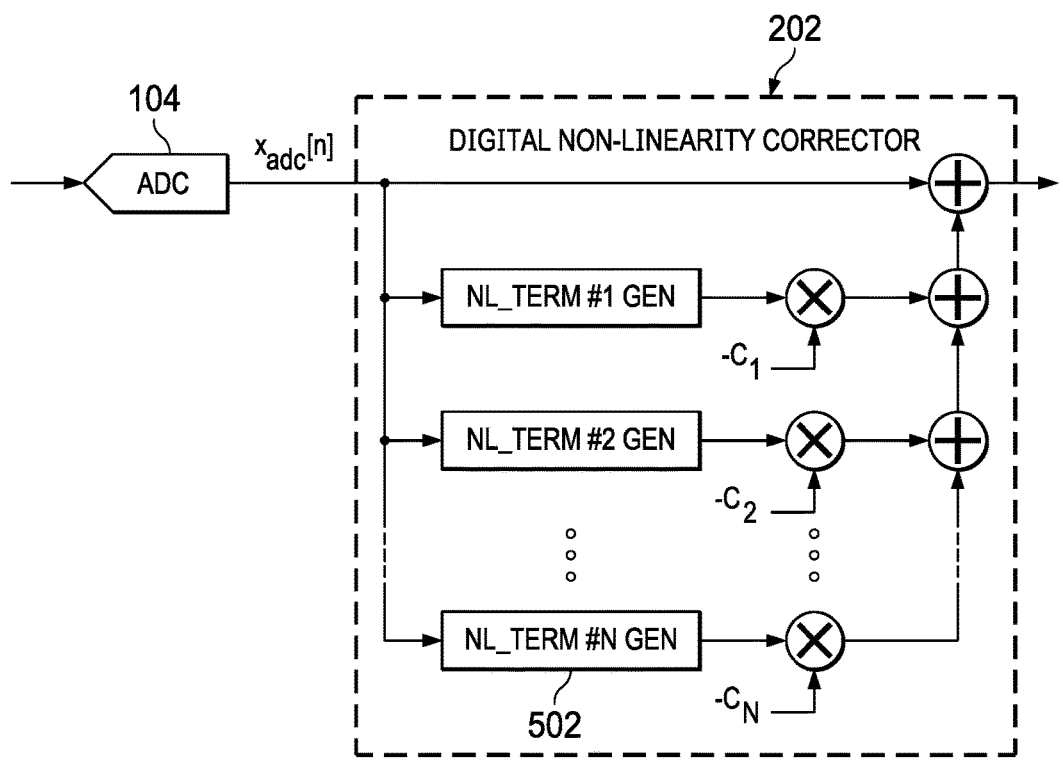
FIG. 5 shows a block diagram for a digital non-linearity corrector circuit.

FIG. 5 shows a block diagram for an example of the non-linearity corrector circuit 202. In the non-linearity corrector circuit 202, the non-linearity term generators 502 produce the various non-linearity terms (such as the 2nd and 3rd order non-linearity terms shown above for use in non-linearity correction. The coefficient values ($C_1 \ldots C_N$) are estimated and provided to the non-linearity corrector circuit 202 for use in non-linearity correction. The values of the coefficients vary with different instances of the DSA circuit 102, the ADC 104, and temperature.

Assume that the digital non-linearity correction applied to the ADC 104 or analog circuit is modeled using four terms as:

$$y[n] = x[n] + c_1 x^3[n] + c_2 x^2[n] x'[n] + c_3 x^2[n] + c_4 x[n] x'[n] + \text{noise} \quad (3)$$

where:
x[n] is the discretized output of the ADC 104 or analog circuit;
x'[n] is the effective derivative of x[n] i.e., the output of the ADC 104;
$c_i$ is the coefficient of each non-linearity term; and
y[n] is the output of the digital non-linearity corrector.

Equation (3) can be written in the frequency domain as:

$$F(y[n]) = F(x[n]) + c_1 F(x^3[n]) + c_2 F(x^2[n] x'[n]) + c_3 F(x^2[n]) + c_4 F(x[n] x'[n]) + \text{noise} \quad (4)$$

$$\Rightarrow c_1 F(x^3[n]) + c_2 F(x^2[n] x'[n]) + c_3 F(x^2[n]) + c_4 F(x[n] x'[n]) = F(y[n]) - F(x[n]) - F(\text{noise})$$

where equation (4) is valid for each frequency bin.

The left side of equation (4) represents the non-linearity introduced by the ADC 104 or an associated analog circuit. At frequency bins where there is no ADC input signal, the above equation (4) can be written as:

$$\Rightarrow c_1 F(x^3[n]) + c_2 F(x^2[n] x'[n]) + c_3 F(x^2[n]) + c_4 F(x[n] x'[n]) = -F(x[n]) - F(\text{noise}) \quad (5)$$

Equation (5) can be used for estimating the non-linear coefficients $C_1$, $C_2$, $C_3$, and $C_4$. Also, the raw non-linearity levels are below about −55 dBFS. In practice all frequency bins whose signal level is lower than a threshold, e.g., −55 dBFS can be used for estimating the coefficients.

In the selected bins (selected by the bin identification circuit 212), the linear equation simplifies to:

$$\Rightarrow c_1 F(x^3[n]) + c_2 F(x^2[n] x'[n]) + c_3 F(x^2[n]) + c_4 F(x[n] x'[n]) = -F(x[n]) - F(\text{noise}) \quad (6)$$

The non-linearity correction circuits identify multiple such linear equations and solves the equations to estimate all non-linearity term coefficients.

For each selected bin, there is one linear equation. For example, for $x^3[n]$ non-linearity or any other third order nonlinearity or a combination of $3^{rd}$ order nonlinearity terms, each data block provides six equations for a two tone input. If there are 100 data capture blocks in one non-linearity estimation window, then 600 equations would be stored.

$$\begin{matrix} eq_1 \to \\ eq_2 \to \\ \vdots \\ eq_N \to \end{matrix} \begin{bmatrix} h_{1,1} & h_{1,2} & \ldots & h_{1,T} \\ h_{2,1} & h_{2,2} & \ldots & h_{2,T} \\ \vdots & \vdots & \ddots & \vdots \\ h_{N,1} & h_{N,2} & \ldots & h_{N,T} \end{bmatrix} c = \begin{bmatrix} m_1 \\ m_2 \\ \vdots \\ m_N \end{bmatrix} \Rightarrow Hc = m \quad (7)$$

where:

N is the number of equations, e.g., in equation (7);

T is the number of non-linear terms, example 1: For $x^3[n]$, $x^2x'[n]$, T=2, example 2: For $x^3[n]$, $x^2[n]x'[n]$, $x^2[n]x[n+1]$, $(x'[n])^3$, T=4;

$h_{i,j}$ is the Fourier transform of the jth non-linearity (NL) term from the ith equation at the selected frequency bins from the selected capture set;

c is a T×1 vector of NL term coefficients to be estimated; and $m_i$ is the measurement of the ith equation which is the Fourier transform of the ADC output x[n] at the selected frequency bins from the selected capture set.

Such a system of linear equations (Hc=m) is solved (e.g., using a least squares or Kalman filter based technique) to estimate and track the non-linearity coefficients.

Some implementations of the non-linearity correction circuits allow non-linearity corrected data to be used as input for non-linearity coefficient estimation. If the coefficient estimator input is taken from the input of the non-linearity corrector, the non-linearity estimator sees the entire non-linearity of the ADC 104. However, if the coefficient estimator input is taken from the output of the non-linearity corrector, then the non-linearity estimator only sees residual non-linearity that is left over after non-linearity correction.

$$H\Delta c = m \rightarrow H(c - c_{corr}) = m \rightarrow Hc = Hc_{corr} + m \quad (8)$$

Hence, in some implementations $Hc_{corr}$ is added to m before coefficient estimation to equivalently generate a modified 'm' which reflects the entire non-linearity. This enables the estimator to always estimate the complete ADC non-linearity. Using non-linearity corrector output as input to the coefficient estimation leads to a performance improvement due to reduction of 2nd order effects. Other implementations also estimate residual coefficients from the residual non-linearity and add it to the currently programmed coefficients.

Figure 6:
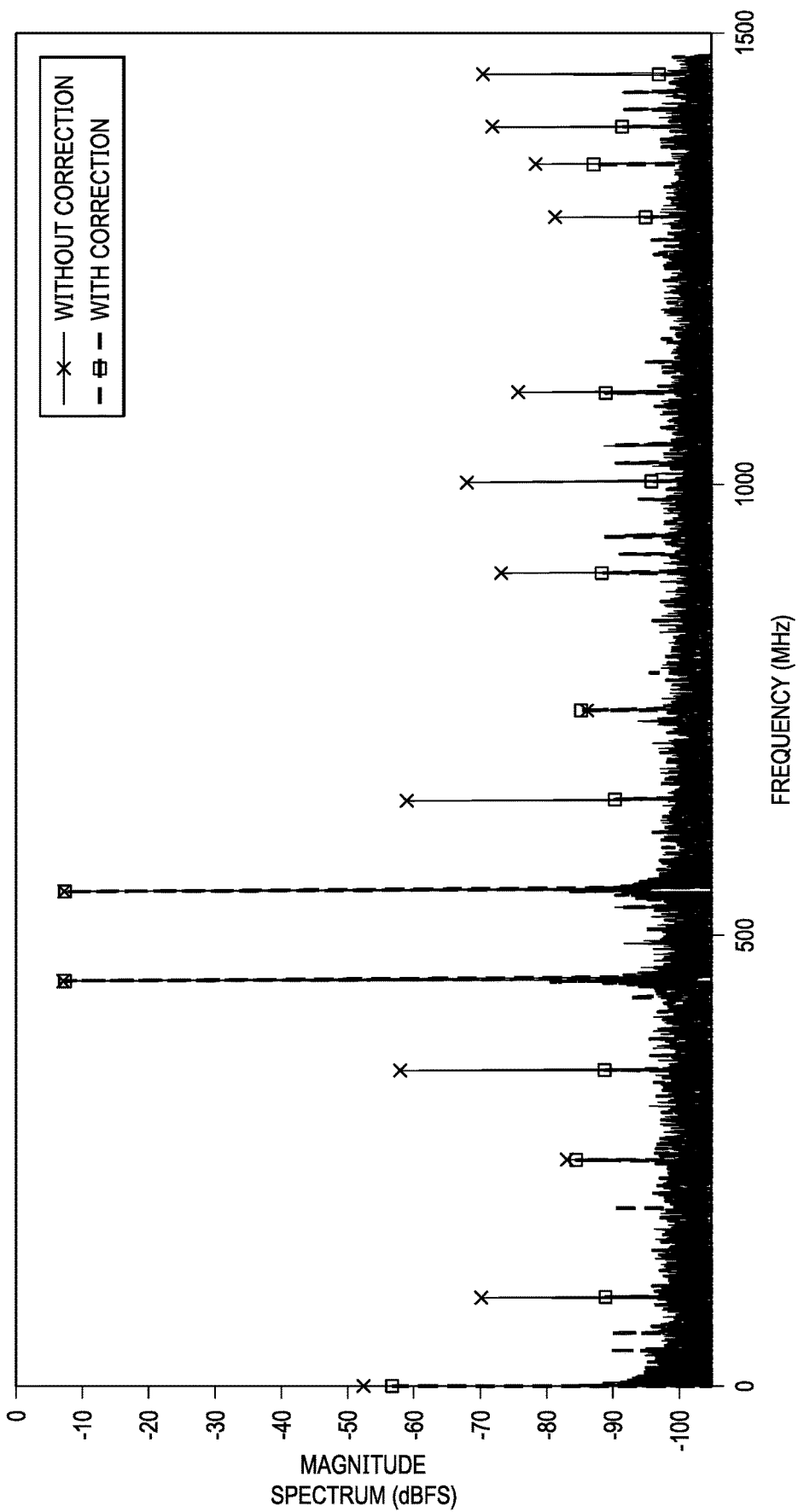
FIG. 6 shows example results of non-linearity correction in accordance with the present disclosure.

FIG. 6 shows example results of non-linearity correction by the non-linearity correction circuit 200 in accordance with the present disclosure. In the example of FIG. 6, operation of the non-linearity correction circuit 200 decreases second and third harmonic distortion from −58 decibels relative to full-scale (dBFS) to −86 dBFS.

In some systems, the input signal provided to the ADC 104 for digitization is highly non-linear (e.g., input signal with digital predistortion). In such systems, the non-linearity correction circuit 200 attempts to compensate for the input signal non-linearity, in addition to non-linearity of the ADC 104 and DSA circuit 102. In such systems, some implementations of the non-linearity correction circuits of the present disclosure include a highly linear, low signal-to-noise ratio reference path to aid non-linearity coefficient estimation. In such non-linearity correction circuits, the reference path facilitates subtraction of digital step attenuator input (including source non-linearity components) from the output of the ADC 104. In systems that include the reference path, some implementations of the non-linearity correction circuit 200 omit checking for low signal power in the bin identification circuit 300 because the fundamental signal has been removed from the signal processed by the non-linearity correction circuit 200.

In practice, circuit components of the main data path and the reference path are not well matched. For example, there are gain, delay, and/or bandwidth mismatches between the main data path and the reference path. The mismatches vary with the settings of the digital step attenuator in some implementations. To compensate for such mismatches, the output of a reference ADC (an ADC in the reference path) is fed to a channel equalizer before being used for signal subtraction. The channel equalizer matches the two data paths for precise cancellation of input signal and source non-linearity. The following non-linearity estimation equation is used for estimation at each identified bin:

$$\Rightarrow c_1 F(x^3[n]) + c_2 F(x^2[n]x'[n]) + c_3 F(x^2[n]) + c_4 F(x[n]x'[n]) = -(F(x[n]) - Ch*F(x_{ref}[n])) - F(\text{noise}) \quad (9)$$

Once the reference path is matched to main path the output of the reference path effectively represents the input to the ADC and DSA circuit, and when subtracted from output of the ADC 104 what is left are components introduced by ADC non-linearity and noise. This is what is represented by the right side of equation (9). Note that the reference path can be noisy and the effect of noise on estimation can be minimized by averaging over time.

Ch models frequency dependent mismatch between the paths. The subtraction of $Ch*F(x_{ref}(n))$ cancels out all of the ADC input present at the selected bins, and, as a result, only non-linearity components of the ADC 104 and DSA circuit 102 remain after cancellation.

Figure 7:
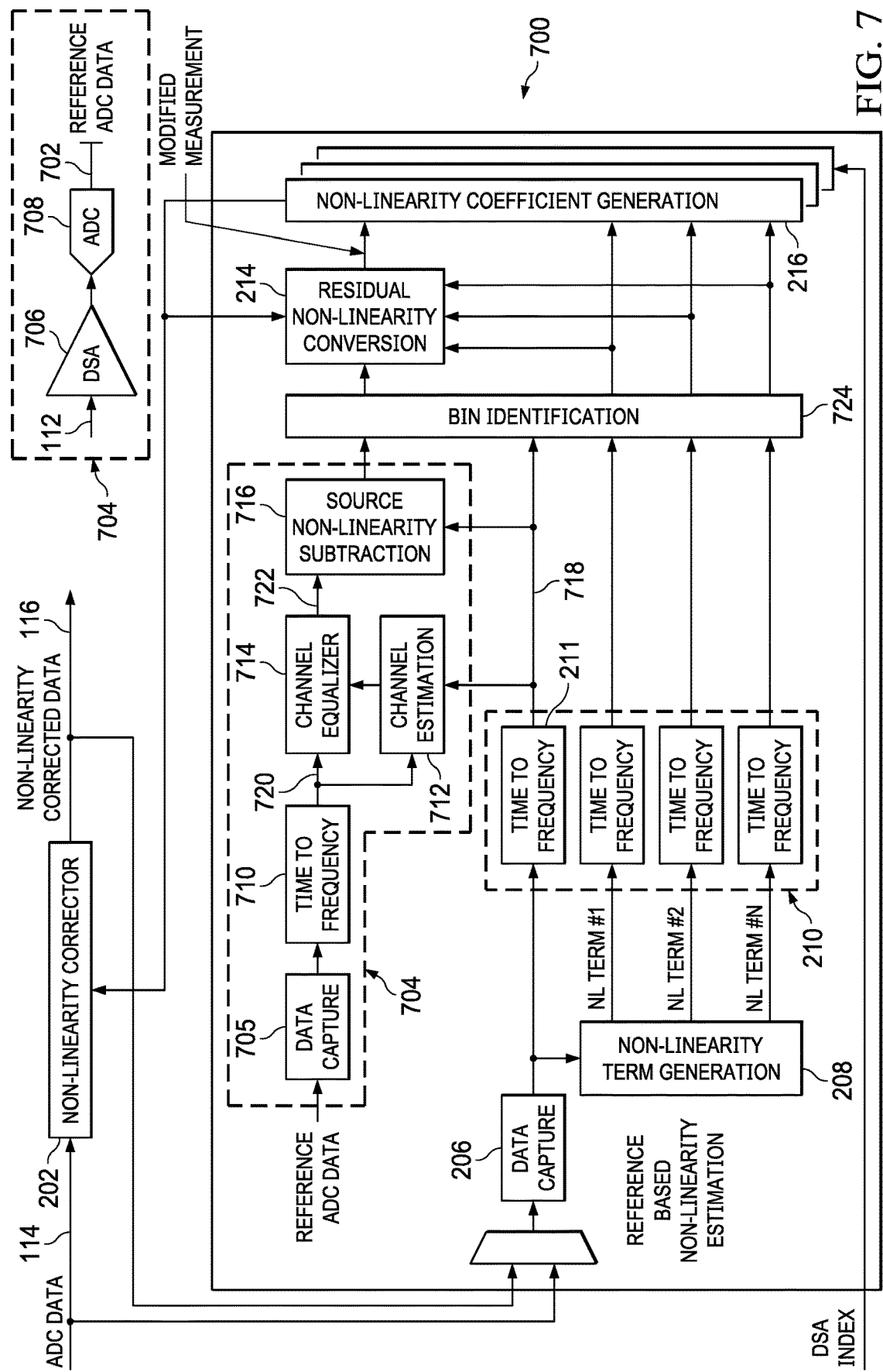
FIG. 7 shows a block diagram for a non-linearity correction circuit that includes a reference data path that subtracts input signal from the signal used to generate non-linearity correction coefficients in accordance with the present disclosure.

FIG. 7 shows a block diagram for a non-linearity correction circuit 700 that includes a reference data path that prevents the non-linearity correction circuit 700 from compensating for input signal non-linearity by subtracting the input signal from the signal used to generate non-linearity correction coefficients. The non-linearity correction circuit 700 includes a reference path 704. The reference path 704 includes a DSA circuit 706, an ADC 708, a data capture circuit 705, a time-to-frequency conversion circuit 710, a channel estimation circuit 712, a channel equalization circuit 714, and a source non-linearity subtraction circuit 716. The DSA circuit 706 is similar to the DSA circuit 120. The DSA circuit 706 includes an input coupled to an input of the DSA circuit 102, and an output coupled to an input of the ADC 708. The reference path 704 is more linear than the data path (main data path) formed by the DSA circuit 102 and the ADC 104 (e.g., the ADC 708 is more linear but possibly noisier than the ADC 104). The ADC 104 and the ADC 708 digitize the input signal 112.

The data capture circuit 705 is coupled to the output of the ADC 708 to capture data samples. The time-to-frequency conversion circuit 710 is coupled to the data capture circuit 705. The samples captured by capture circuit 705 are provided to the time-to-frequency conversion circuit 710. The time-to-frequency conversion circuit 710 converts the time domain captured samples of the ADC 708 to frequency domain signal 720. For example, the time-to-frequency conversion circuit 710 applies an FFT to the output signals received from the ADC 708 to generate the frequency domain signal 720.

The time-to-frequency conversion circuit 710 is coupled to the channel estimation circuit 712. The channel estimation circuit 712 receives the frequency domain signal 720 generated by the time-to-frequency conversion circuit 710 and the frequency domain signal 718 generated by the time-to-frequency conversion circuit 211 and estimates a channel of the data path formed by the DSA circuit 102 and the ADC 104 relative to the reference path of the DSA circuit 706 and the ADC 708. The channel estimation circuit 712 is coupled to the channel equalization circuit 714. The channel equalization circuit is also coupled to the time-to-frequency conversion circuit 710. The channel equalization circuit 714 receives channel estimates from the channel estimation circuit 712 and applies the channel estimates to equalize the frequency domain signal 720 received from the time-to-frequency conversion circuit 710.

The channel equalization circuit 714 is coupled to the source non-linearity subtraction circuit 716. The source non-linearity subtraction circuit 716 receives the frequency domain signal 718 and the equalized output signal 722 generated by the channel equalization circuit 714. The source non-linearity subtraction circuit 716 subtracts the equalized output signal 722 from the frequency domain signal 718 to effectively remove the input signal 112 from the signal provided to the bin identification circuit 724. Thus, the output of the source non-linearity subtraction circuit effectively contains the non-linearity introduced by ADC 104 and DSA circuit 102. The source non-linearity subtraction circuit 716 is coupled to the bin identification circuit 724 and provides frequency domain signal 718 less the equalized output signal 722 to the bin identification circuit 724 for use in determining non-linearity correction coefficients. The bin identification circuit 724 is an implementation of the bin identification circuit 212 and is also coupled to the time-to-frequency conversion circuit 210.

Figure 8:
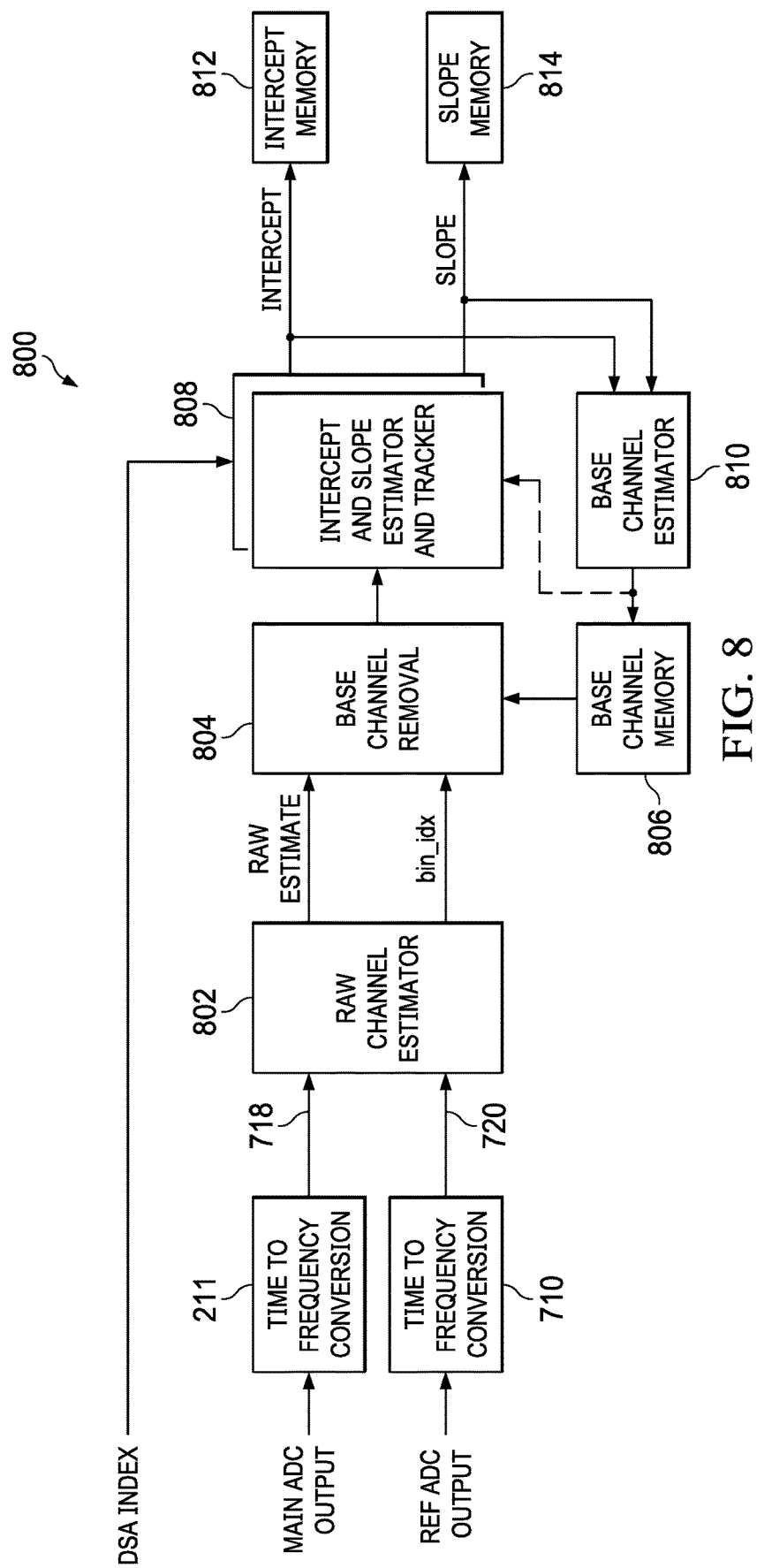
FIG. 8 shows a block diagram for a channel estimation circuit suitable for use in the reference data path of FIG. 7.

The bin identification circuit 724 and the residual non-linearity circuit 214 are coupled to the non-linearity coefficient generation circuit 216. The 216 estimates non-linearity coefficients based on frequency responses of non-linearity terms generated by the non-linearity term generation circuit 208 and output of the source non-linearity subtraction circuit 716 at frequency bins identified by the bin identification circuit 724. At the frequency bins identified by the bin identification circuit 724, the frequency responses of the non-linearity terms serve as weights of the non-linearity coefficients; and the output of the source non-linearity subtraction circuit 716 serves as a measurement in the estimate of the non-linearity coefficients;

FIG. 8 shows a block diagram for a channel estimation circuit 800 suitable for use in the reference path 704. The channel estimation circuit 800 is an implementation of the channel estimation circuit 712. The channel estimation circuit 800 includes a raw channel estimation circuit 802, a base channel removal circuit 804, base channel memory 806, a slope and intercept estimation circuit 808, a base channel estimator 810, an intercept memory 812, and a slope memory 814. The raw channel estimation circuit 802 receives the frequency domain signal 718 and the frequency domain signal 720 and provides a raw channel estimate value for each frequency bin by correlating main path frequency domain response with reference frequency domain response at each bin. The raw channel estimate is, for example, obtained as shown in equation (10). The raw inverse channel estimate is a ratio of accumulated cross correlation of frequency responses of main and reference paths to accumulated power of main path response for a given frequency bin.

$$\text{Inverse\_H}_{ch}(f) = \frac{\sum X(f) X_{ref}^*(f)}{\sum |X(f)|^2} \quad (10)$$

$$H_{ch}(f) = 1/\text{Inverse\_H}_{ch}(f)$$

The base channel removal circuit 804 is coupled to the raw channel estimation circuit 802 and the base channel memory 806. The base channel memory 806 provides base channel values to the base channel removal circuit 804 for use in adjustment of the raw channel values. The base channel removal circuit 804 receives the raw channel estimates generated by the raw channel estimation circuit 802 and adjusts each raw channel estimate to remove a base channel estimate value. With the raw channel estimates and the bin locations for the estimates at a given DSA setting, the base channel removal circuit 804 compensates the base channel response contribution from the raw channel estimates at the bin locations.

The slope and intercept estimation circuit 808 is coupled to the base channel memory 806 and the base channel removal circuit 804. The slope and intercept estimation circuit 808 processes the adjusted channel value received from the base channel removal circuit 804 to estimate and track a slope value and an intercept value for each DSA setting. The slope and intercept estimation circuit 808 is coupled to the intercept memory 812 and the slope memory 814. The slope and intercept estimation circuit 808 stores intercept values in the intercept memory 812 and stores slope values in the slope memory 814 for a DSA index value.

The base channel estimator 810 is coupled to the slope and intercept estimation circuit 808, the intercept memory 812, and the slope memory 814. The base channel estimator 810 estimates base channel values using the slope and intercept values respectively stored in the slope memory 814 and the intercept memory 812. The base channel values model the frequency dependent common mismatch across different DSA settings, while the slope and intercept values model the small residual mismatch for each DSA setting. The base channel estimator 810 is coupled to the base channel memory 806, and stores the base channel values in the base channel memory 806. The base channel estimator 810 computes gain and delay mismatches for each DSA setting using the corresponding intercept and slope values. If a common gain and/or delay component is identified across all DSA settings, the base channel estimator 810 applies the common part of the mismatch to refine the base channel response. The refined base channel response is stored in the base channel memory 806. Given the refined base channel response, the previously estimated intercept and slope parameters are adjusted across all DSA settings to reflect only the residual mismatch. The adjusted slope and intercept values are stored in the slope memory 814 and the intercept memory 812 respectively.

Once we know a common gain or delay mismatch across all the DSA settings is established, then the base channel is updated as:

$$\text{new\_base\_ch[bin]} = \text{old\_base\_ch[bin]} * g_{mm} * e^{-j*2*pi*\frac{bin}{N_{FFT}}*d_{mm}} \quad (11)$$

where:

bin is a particular frequency bin location, and bin ranges from 0, 1, . . . , $N_{FFT}-1$;

$g_{mm}$ is common gain mismatch across all the DSA settings;

$d_{mm}$ is common delay mismatch across all the DSA setting; and $N_{FFT}$ is size of FFT used for time-to-frequency conversion.

old_basec_ch is unity at start in some implementations.

When the base channel has been updated, the intercept and slope are updated for each DSA setting as follows:

channel[bin][DSA]=old_base_ch[bin]*(old_Intercept [DSA]+bin*old_slope[DSA])=new_base_ch[bin] *(new_Intercept[DSA]+bin*new_slope[DSA]) (12)

Equation (12) is applied at two bin locations for each DSA index. For example, at bin=10 and 100. Then, both the linear equations are solved to derive new intercept and new slope values for each DSA index.

Figure 9:
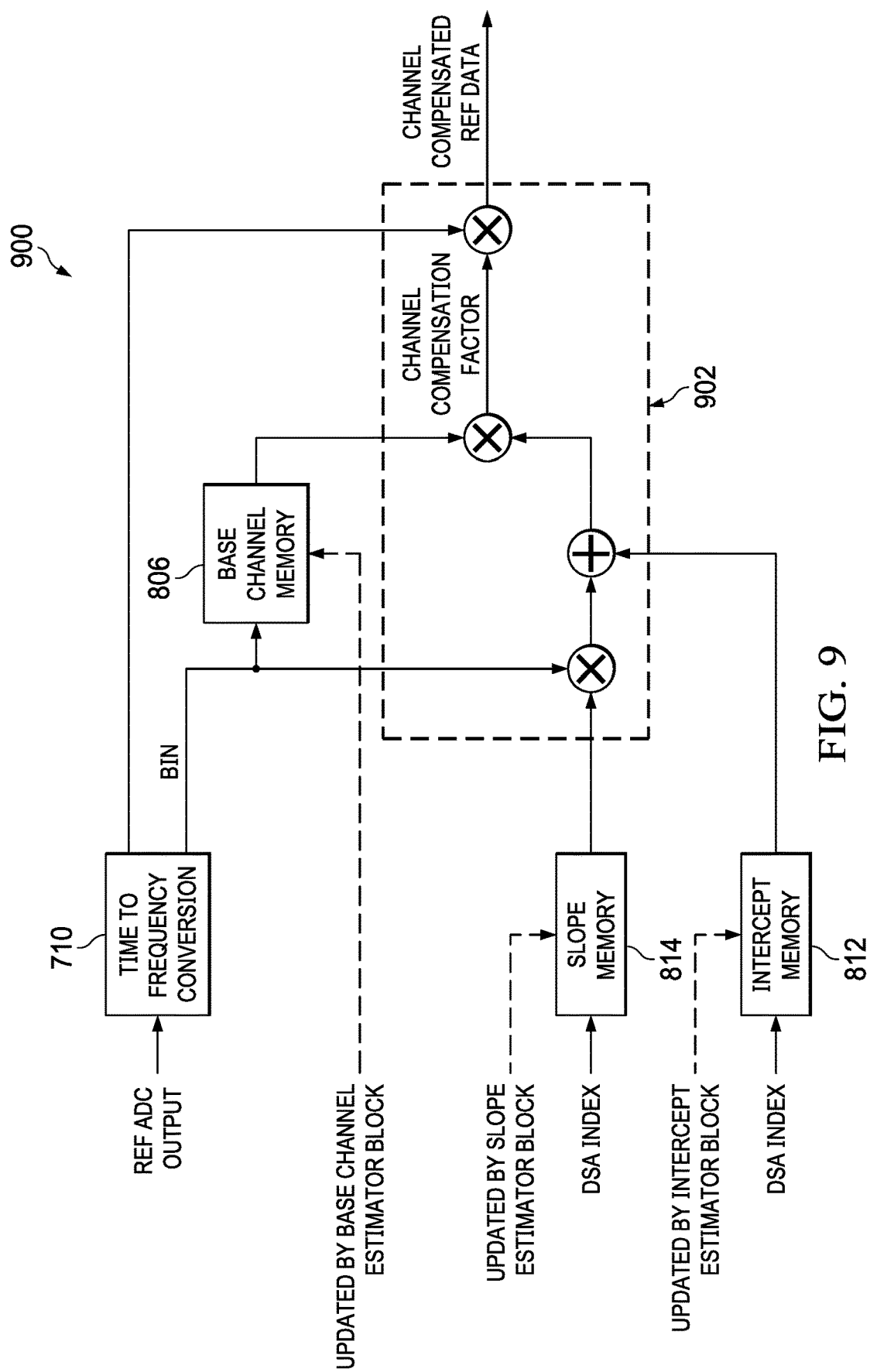
FIG. 9 shows a block diagram for a channel equalization circuit suitable for use in the reference data path of FIG. 7.

FIG. 9 shows a block diagram for a channel equalization circuit 900 suitable for use in the reference path 704. The channel equalization circuit 900 is an implementation of the channel equalization circuit 714. The channel equalization circuit 900 is coupled to the time-to-frequency conversion circuit 710, the base channel memory 806, the intercept memory 812, and the slope memory 814. The channel equalization circuit 900 includes a computation circuit 902 that computes a channel compensation value (a channel equalization value) for each frequency bin and applies the channel compensation value to the frequency domain reference data for each frequency bin to equalize the reference path 704. The computation circuit 902 of the channel equalization circuit 900 computes the channel compensation value as:

$$\text{Channel}[DSA][Bin] = \text{BaseChannel}[Bin] * (C_{Intercept}[DSA] + C_{Slope}[DSA] * Bin) \quad (13)$$

where:
Channel is a channel compensation value;
DSA is an attenuation selection index (a DSA index value) applied in the DSA circuit 102;
Bin is a frequency bin index;
BaseChannel is a base channel value retrieved from the base channel memory 806
$C_{Intercept}$ is an intercept value retrieved from the intercept memory 812; and
$C_{Slope}$ is a slope value retrieved from the slope memory 814.

The channel equalization circuit 900 computes an equalized data value a product of the channel compensation value and a value of the frequency domain signal 720 (i.e., a frequency domain data value). Implementations of the channel equalization circuit 900 are compact in size (e.g., in a range of $1/8^{th}$ the size of other equalization circuits).

Figure 10:
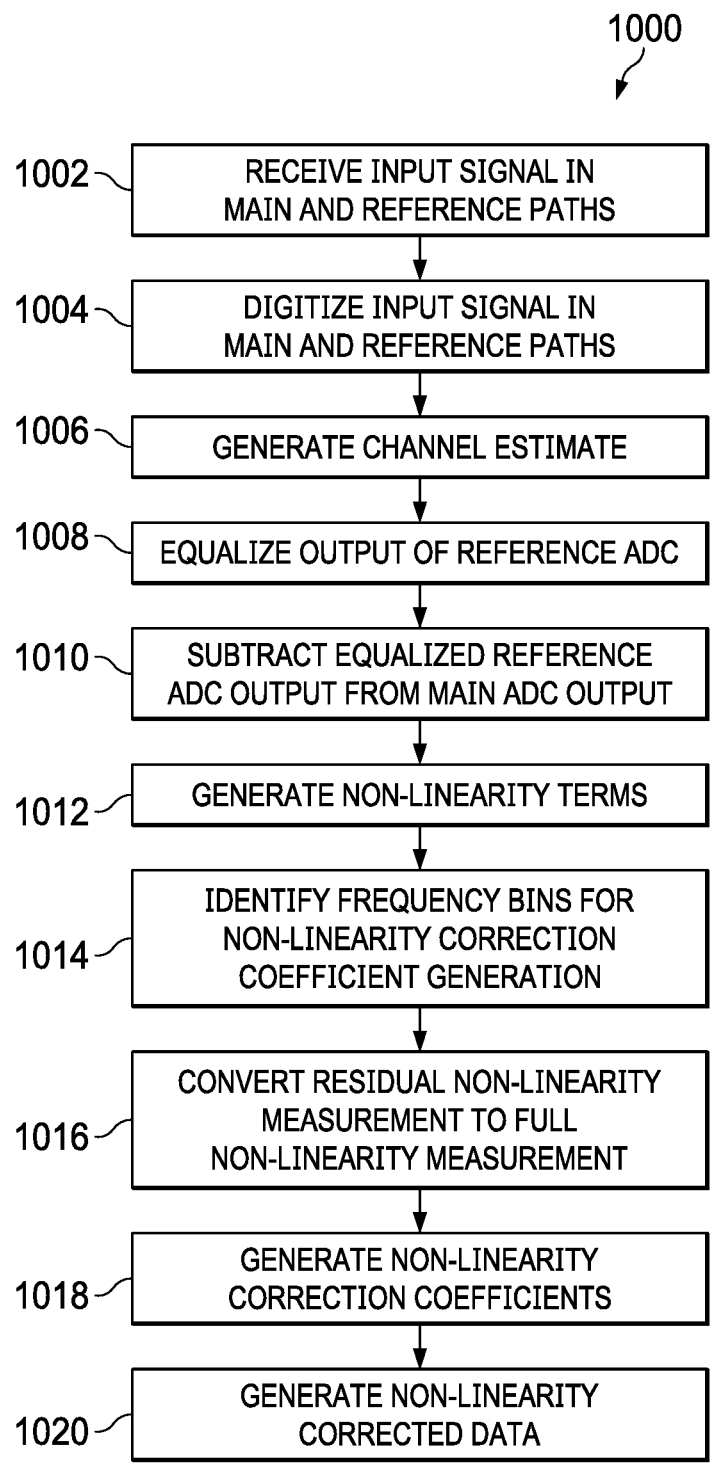
FIGS. 10 and 11 show flow diagrams for methods for non-linearity correction in accordance with the present disclosure.

FIG. 10 shows a flow diagram for a method 1000 for non-linearity correction in accordance with the present disclosure. Though depicted sequentially as a matter of convenience, at least some of the actions shown can be performed in a different order and/or performed in parallel. Additionally, some implementations may perform only some of the actions shown. Operations of the method 1000 are performed by implementations of the non-linearity correction circuit 700.

In block 1002, the non-linearity correction circuit 700 receives a signal as input to the main data path) (formed by the DSA circuit 102 and the ADC 104) and the reference path 704. For example, an input signal is provided at the input of the DSA circuit 102 and the input of the DSA circuit 706. The input signal includes non-linearity in some examples.

In block 1004, the ADC 104 digitizes the input signal in the main data path and the ADC 708 digitizes the input signal in the reference path 704. The data capture circuit 206 is coupled to, and captures output of, the ADC 104, and the data capture circuit 705 captures output of the ADC 708. In some implementations of the method 1000, the data capture circuit 206 selectably captures the output of the ADC 104, or the output of the non-linearity corrector circuit 202 for use as estimation input data. The time-to-frequency conversion circuit 211 converts the captured digital output of the ADC 104 from time domain to frequency domain, and the time-to-frequency conversion circuit 710 converts the captured digital output of the ADC 708 from time domain to frequency domain.

In block 1006, the channel estimation circuit 712 processes the frequency domain data provided by the time-to-frequency conversion circuits 710 and 211 to generate a channel estimate for the reference path 704 relative to the main data path.

In block 1008, the channel equalization circuit 714 applies the channel estimate generated by the channel estimation circuit 712 to equalize the frequency domain signal 720.

In block 1010, the source non-linearity subtraction circuit 716 subtracts the equalized output signal 722 (equalized output of the ADC 708 in the frequency domain) from the frequency domain signal 718 (frequency domain output of the ADC 104) to produce a reference subtracted signal.

In block 1012, the non-linearity term generation circuit 208 processes the captured data and generates non-linearity terms for the data captured by data capture circuit 206. The time-to-frequency conversion circuit 210 converts the data captured by the data capture circuit 206 and the non-linearity terms generated by the non-linearity term generation circuit 208 from time-domain to frequency-domain.

In block 1014, the bin identification circuit 212, identifies frequency bins to apply in estimation of the non-linearity correction coefficients. The identified frequency bins are frequency bins having signal power below a first threshold and non-linearity power above a second threshold.

In block 1016, the residual non-linearity conversion circuit 214 converts residual non-linearity measurement to full non-linearity measurement by modifying the frequency response of signal at the identified frequency bins. The frequency response is modified by adding a plurality of correction terms to the signal, where each correction term is a product of frequency response of the non-linearity terms with corresponding non-linearity correction coefficients currently used in the non-linearity corrector circuit 202.

In block 1018, the non-linearity coefficient generation circuit 216 generates and tracks non-linearity correction coefficients based on the signal (the reference subtracted signal) and non-linearity terms at the frequency bins identified by the bin identification circuit 212.

In block 1020, the non-linearity corrector circuit 202 applies the non-linearity correction coefficients to compensate the non-linearity corrected data 116 for the non-linearities introduced in the digital signal 114 by the ADC 104 and DSA circuit 102.

Figure 11:
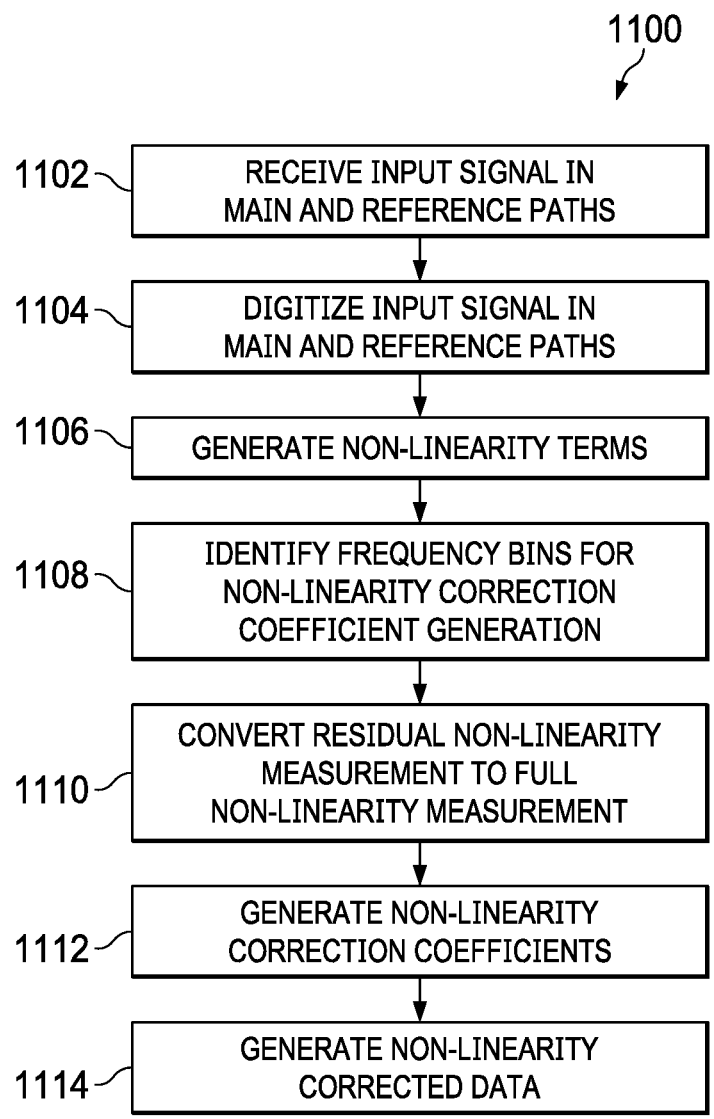

FIG. 11 shows a flow diagram for a method 1100 for non-linearity correction in accordance with the present disclosure. Though depicted sequentially as a matter of convenience, at least some of the actions shown can be performed in a different order and/or performed in parallel. Additionally, some implementations may perform only some of the actions shown. Operations of the method 1100 are performed by implementations of the non-linearity correction circuit 200.

In block 1102, the non-linearity correction circuit 200 receives a signal as input to the DSA circuit 102 and the ADC 104. For example, an input signal is provided at the input of the DSA circuit 102.

In block 1104, the ADC 104 digitizes the input signal. The data capture circuit 206 captures output of the ADC 104. In some implementations of the method 1100, the data capture circuit 206 selectably captures the output of the ADC 104, or the output of the non-linearity corrector circuit 202 for use as estimation input data. The time-to-frequency conversion circuit 211 converts the digital output of the ADC 104 from time domain to frequency domain.

In block 1106, the non-linearity term generation circuit 208 processes the captured data and generates non-linearity terms for the captured data. The time-to-frequency conversion circuit 210 converts the data captured by the data capture circuit 206 and the non-linearity terms generated by the non-linearity term generation circuit 208 from time-domain to frequency-domain.

In block 1108, the bin identification circuit 212, identifies frequency bins to apply in estimation of the non-linearity correction coefficients. The identified frequency bins are frequency bins having signal power below a first threshold and non-linearity power above a second threshold.

In block 1110, the residual non-linearity conversion circuit 214 converts residual non-linearity measurement to full non-linearity measurement by modifying the frequency response of signal at the identified frequency bins. The frequency response is modified by adding a plurality of correction terms to the signal, where each correction term is a product of frequency response of the non-linearity terms with corresponding non-linearity correction coefficients currently used in the non-linearity corrector circuit 202.

In block 1112, the non-linearity coefficient generation circuit 216 generates and tracks non-linearity correction coefficients based on the signal and non-linearity terms at the frequency bins identified by the bin identification circuit 212.

In block 1114, the non-linearity corrector circuit 202 applies the non-linearity correction coefficients to compensate the non-linearity corrected data 116 for the non-linearities introduced in the digital signal 114 by the ADC 104.

Modifications are possible in the described embodiments, and other embodiments are possible, within the scope of the claims.

What is claimed is:

1. A non-linearity correction circuit, comprising:
   a non-linearity coefficient estimation circuit comprising:
   a data capture circuit;
   a non-linearity term generation circuit coupled to the data capture circuit;
   a time-to-frequency conversion circuit coupled to the data capture circuit and the non-linearity term generation circuit;
   a bin identification circuit coupled to the time-to-frequency conversion circuit;
   a residual non-linearity conversion circuit coupled to the bin identification circuit; and
   a non-linearity coefficient generation circuit coupled to the bin identification circuit and the residual non-linearity conversion circuit.

2. The non-linearity correction circuit of claim 1, further comprising a non-linearity corrector circuit coupled to the non-linearity coefficient estimation circuit, and configured to generate non-linearity corrected data based on non-linearity correction coefficients generated by the non-linearity coefficient generation circuit.

3. The non-linearity correction circuit of claim 2, wherein the data capture circuit is configured to capture the non-linearity corrected data.

4. The non-linearity correction circuit of claim 2, wherein the data capture circuit is configured to capture raw data samples provided as input to the non-linearity corrector circuit for non-linearity correction.

5. The non-linearity correction circuit of claim 1, wherein the non-linearity term generation circuit is configured to generate non-linearity terms for the data captured by the data capture circuit.

6. The non-linearity correction circuit of claim 5, wherein the time-to-frequency conversion circuit is configured to convert the non-linearity terms and data captured by the data capture circuit from time domain to frequency domain.

7. The non-linearity correction circuit of claim 5, wherein:
   the non-linearity coefficient generation circuit is configured to estimate non-linearity coefficients based on frequency responses of the non-linearity terms and frequency response of output of the data capture circuit at frequency bins identified by the bin identification circuit; and
   at each bin identified by the bin identification circuit, the frequency responses of the non-linearity terms serve as weights of the non-linearity coefficients; and the frequency response of the output of the data capture circuit serves as a measurement in the estimate of the non-linearity coefficients.

8. The non-linearity correction circuit of claim 5, wherein the bin identification circuit is configured to identify frequency bins to apply in estimation of non-linearity correction coefficients as bins having signal power below a first threshold and non-linearity term power above a second threshold.

9. The non-linearity correction circuit of claim 8, wherein the residual non-linearity conversion circuit is configured to modify frequency response of a signal at the frequency bins by adding a plurality of correction terms to the signal wherein each correction term is a product of frequency response of the non-linearity terms with corresponding non-linearity correction coefficients.

10. The non-linearity correction circuit of claim 1, wherein:
    the data capture circuit is a first data capture circuit;
    the time-to-frequency conversion circuit is a first time-to-frequency conversion circuit; and
    the non-linearity correction circuit further comprises:
    a data path comprising:
      a first digital step attenuator (DSA); and
      a first analog-to-digital converter (ADC) coupled to the first data capture circuit; and
    a reference path comprising:
      a second DSA comprising an input coupled to an input of the first DSA;
      a second ADC coupled to the second DSA;
      a second data capture circuit coupled to the second ADC;
      a second time-to-frequency conversion circuit coupled to the second data capture circuit;
      a channel estimation circuit coupled to the first time-to-frequency conversion circuit and the second time-to-frequency conversion circuit;
      a channel equalization circuit coupled to the channel estimation circuit and the second time-to-frequency conversion circuit; and
      a source non-linearity subtraction circuit coupled to the channel equalization circuit, the first time-to-frequency conversion circuit, and the bin identification circuit.

11. The non-linearity correction circuit of claim 10, wherein the channel equalization circuit is configured to equalize the reference path to the data path.

12. The non-linearity correction circuit of claim 10, wherein the channel estimation circuit comprises:
    a base channel memory;
    a slope memory;
    an intercept memory;
    a raw channel estimation circuit configured to generate a raw channel estimate based on output of the first ADC and output of the second ADC;
    a base channel removal circuit coupled to the raw channel estimation circuit and the base channel memory;

a slope and intercept estimation circuit coupled to the base channel removal circuit, the slope memory, and the intercept memory; and a base channel estimator coupled to the slope and intercept estimation circuit and the base channel memory.

13. The non-linearity correction circuit of claim 12 wherein the channel equalization circuit comprises a computation circuit configured to:

compute a channel equalization value as a product of:
a base channel value retrieved from the base channel memory; and
a sum of an intercept value retrieved from the intercept memory and a slope value retrieved from the slope memory multiplied by a frequency bin index; and compute an equalized data value as a product of the channel equalization value and a frequency domain data value produced by the second time-to-frequency conversion circuit.

14. A non-linearity correction circuit, comprising:
a data path comprising:
a first digital step attenuator (DSA);
a first analog-to-digital converter (ADC);
a first data capture circuit coupled to the first ADC; and
a first time-to-frequency conversion circuit coupled to the first data capture circuit;
a reference path comprising:
a second DSA comprising an input coupled to an input of the first DSA;
a second ADC coupled to the second DSA;
a second data capture circuit coupled to the second ADC;
a second time-to-frequency conversion circuit coupled the second data capture circuit;
a channel estimation circuit coupled to the first time-to-frequency conversion circuit and the second time-to-frequency conversion circuit;
a channel equalization circuit coupled to the channel estimation circuit and the second time-to-frequency conversion circuit; and
a source non-linearity subtraction circuit coupled to the channel equalization circuit and the first time-to-frequency conversion circuit; and
a non-linearity term generation circuit coupled to the first data capture circuit and the first time-to-frequency conversion circuit;
a bin identification circuit coupled to the source non-linearity subtraction circuit and the first time-to-frequency conversion circuit;
a residual non-linearity conversion circuit coupled to the bin identification circuit; and
a non-linearity coefficient generation circuit coupled to the bin identification circuit and the residual non-linearity conversion circuit.

15. The non-linearity correction circuit of claim 14, wherein:
the non-linearity coefficient generation circuit is configured to estimate non-linearity coefficients based on frequency responses of non-linearity terms generated by the non-linearity term generation circuit and output of the source non-linearity subtraction circuit at frequency bins identified by the bin identification circuit; and
at the frequency bins identified by the bin identification circuit, the frequency responses of the non-linearity terms serve as weights of the non-linearity coefficients;

and the output of the source non-linearity subtraction circuit serves as a measurement in the estimate of the non-linearity coefficients.

16. The non-linearity correction circuit of claim 14, wherein the channel estimation circuit is configured to equalize the reference path to the data path.

17. The non-linearity correction circuit of claim 14, wherein the channel estimation circuit comprises:
a slope memory configured to store a slope value for a DSA index value;
an intercept memory configured to store an intercept value for the DSA index value;
a base channel memory configured to store a base channel value for a frequency bin;
a raw channel estimation circuit configured to generate a raw channel estimate based on output of the first ADC and output of the second ADC;
a base channel removal circuit coupled to the raw channel estimation circuit and the base channel memory;
a slope and intercept estimation circuit coupled to the base channel removal circuit, the slope memory, and the intercept memory; and
a base channel estimator coupled to the slope and intercept estimation circuit and the base channel memory.

18. The non-linearity correction circuit of claim 17, wherein the channel equalization circuit comprises:
a computation circuit configured to compute a channel compensation value for the frequency bin as a product of the base channel value for the frequency bin and a sum of the intercept value and a product of slope value for the DSA index value and a frequency bin index.

19. The non-linearity correction circuit of claim 14, further comprising a non-linearity corrector circuit coupled to the non-linearity coefficient generation circuit, and configured to generate non-linearity corrected data based on non-linearity correction coefficients generated by the non-linearity coefficient generation circuit.

20. The non-linearity correction circuit of claim 19, wherein the first data capture circuit is configured to selectably capture the non-linearity corrected data or raw data samples provided by the first ADC to the non-linearity corrector circuit for non-linearity correction.

21. The non-linearity correction circuit of claim 20, wherein the non-linearity term generation circuit is configured to generate non-linearity terms for data captured by the first data capture circuit.

22. The non-linearity correction circuit of claim 21, wherein the first time-to-frequency conversion circuit is configured to convert, from time domain to frequency domain, the non-linearity terms, and data samples generated by the first ADC and captured by the first data capture circuit.

23. The non-linearity correction circuit of claim 21, wherein the bin identification circuit is configured to identify frequency bins to apply in estimation of non-linearity correction coefficients as bins having signal power, of samples generated by the first ADC, below a first threshold and non-linearity term power above a second threshold.

24. The non-linearity correction circuit of claim 23, wherein the residual non-linearity conversion circuit is configured to modify frequency response of a signal at the frequency bins by adding a plurality of correction terms to the signal wherein each correction term is a product of frequency response of the non-linearity terms with corresponding non-linearity correction coefficients currently used in the non-linearity corrector circuit.

25. A method for non-linearity correction, comprising:
receiving a signal as input to a main data path and a reference data path;
digitizing the signal by a first analog-to-digital converter (ADC) of the main data path and by a second ADC of the reference data path;
subtracting output of the second ADC from output of the first ADC to produce reference subtracted signal;
estimating non-linearity correction coefficients based on the reference subtracted signal; and
applying the non-linearity correction coefficients to the output of the first ADC to generate non-linearity corrected data.

26. The method of claim 25, further comprising:
generating a channel estimate of the reference data path relative to the main data path based on the output of the second ADC and the output of the first ADC; and
equalizing, prior to the subtracting, the output of the second ADC based on the channel estimate.

27. The method of claim 26, further comprising:
generating non-linearity terms from the output of the first ADC; and
identifying frequency bins to apply in estimation of the non-linearity correction coefficients as frequency bins having signal power below a first threshold and non-linearity power above a second threshold.

28. The method of claim 27, further comprising modifying frequency response of the reference subtracted signal at the frequency bins by adding a plurality of correction terms to the signal at the frequency bins, wherein each correction term is a product of frequency response of the non-linearity terms with corresponding non-linearity correction coefficients currently used to correct the output of the first ADC.

* * * * *